(12) United States Patent
Buckley et al.

(10) Patent No.: US 11,824,000 B2
(45) Date of Patent: Nov. 21, 2023

(54) FIELD EFFECT TRANSISTOR AND ASSOCIATED MANUFACTURING METHOD

(71) Applicant: COMMISSARIAT À L'ÉNERGIE ATOMIQUE ET AUX ÉNERGIES ALTERNATIVES, Paris (FR)

(72) Inventors: Julien Buckley, Grenoble (FR); René Escoffier, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 515 days.

(21) Appl. No.: 17/267,408

(22) PCT Filed: Aug. 8, 2019

(86) PCT No.: PCT/EP2019/071361
§ 371 (c)(1),
(2) Date: Feb. 9, 2021

(87) PCT Pub. No.: WO2020/303757
PCT Pub. Date: Feb. 13, 2020

(65) Prior Publication Data
US 2021/0305156 A1 Sep. 30, 2021

(30) Foreign Application Priority Data
Aug. 10, 2018 (FR) ...................... 1857444

(51) Int. Cl.
*H01L 23/525* (2006.01)
*H01L 29/20* (2006.01)
(Continued)

(52) U.S. Cl.
CPC ...... *H01L 23/5256* (2013.01); *H01L 29/2003* (2013.01); *H01L 29/66462* (2013.01); *H01L 29/7786* (2013.01)

(58) Field of Classification Search
CPC ............. H01L 23/5256; H01L 29/2003; H01L 29/66462; H01L 29/7786
See application file for complete search history.

(56) References Cited

U.S. PATENT DOCUMENTS

| 4,742,425 A | 5/1988 | Conzelmann et al. |
| 4,795,720 A | 1/1989 | Kawanabe et al. |
| (Continued) |

FOREIGN PATENT DOCUMENTS

| EP | 2 690 657 A2 | 1/2014 |
| JP | 2004-235183 A | 8/2004 |
| (Continued) |

OTHER PUBLICATIONS

Slade, P. G., et al., "Electrical Breakdown in Atmospheric Air Between Closely Spaced (0.2µm-40µm) Electrical Contacts," IEEE Transactions on Components and Packaging Technologies, vol. 25, No. 3, Sep. 2002, pp. 390-396.
(Continued)

*Primary Examiner* — Peter M Albrecht
(74) *Attorney, Agent, or Firm* — Pillsbury Winthrop Shaw Pittman LLP (57) ABSTRACT

A field effect transistor includes a substrate; a semiconductor structure formed on a main face of the substrate, the semiconductor structure including a channel area; a first electrode and a second electrode between which extends the channel area, the first electrode including a plurality of portions spaced apart from each other, each portion of the first electrode contributing to forming an elementary transistor referred to as island; connection tracks for electrically connecting the portions of the first electrode to one another; and in which each portion of the first electrode is connected to a connection track through a fuse area, each fuse area associated with the portion of the first electrode of an island
(Continued)

being capable of being broken in such a way as to electrically insulate said island if it is defective.

12 Claims, 4 Drawing Sheets

(51) Int. Cl.
*H01L 29/66* (2006.01)
*H01L 29/778* (2006.01)

(56) References Cited

U.S. PATENT DOCUMENTS

| | | |
|---|---|---|
| 4,942,308 A | 7/1990 | Conzelmann et al. |
| 2009/0026506 A1 | 1/2009 | Matsumiya et al. |
| 2011/0001736 A1 | 1/2011 | Tanaka et al. |
| 2011/0186858 A1 | 8/2011 | Roberts et al. |

FOREIGN PATENT DOCUMENTS

| | | |
|---|---|---|
| JP | 10-2011-0035406 A | 4/2011 |
| JP | 2017-204653 A | 11/2017 |
| WO | WO 2010/013195 A1 | 2/2010 |

OTHER PUBLICATIONS

International Search Report as issued in International Patent Application No. PCT/EP2019/073161, dated Nov. 4, 2019.

FIELD EFFECT TRANSISTOR AND ASSOCIATED MANUFACTURING METHOD

CROSS-REFERENCE TO RELATED APPLICATIONS

This application is the U.S. National Stage of PCT/EP2019/071361, filed Aug. 8, 2019, which in turn claims priority to French patent application number 1857444 filed Aug. 10, 2018. The content of these applications are incorporated herein by reference in their entireties.

TECHNICAL FIELD OF THE INVENTION

The present invention relates to field effect transistors, and more specifically transistors comprising several elementary transistors connected in parallel.

TECHNOLOGICAL BACKGROUND OF THE INVENTION

Power transistors are intended to be traversed by high intensity electrical currents, that is to say currents of several tens of amperes. Power transistors thus have large dimensions, compatible with these current levels.

Conventionally, such transistors of large dimensions are produced by connecting in parallel several elementary transistors, referred to as "islands", having smaller dimensions. However, during the manufacture of a transistor, it may happen that a short-circuit occurs at the level of certain islands, which makes the whole of the transistor unusable.

To overcome this drawback, a method is known from the prior art for electrically insulating defective islands from functional islands. This method consists in testing the islands one by one to find those having a short-circuit. The latter are then insulated by means of a layer of a polymer material which is deposited on all of the islands and which is next etched to leave accessible to metallisation only the functional islands. The problem of this method is that its implementation requires a lot of time.

The document EP2690657 describes a field effect transistor, for example of GaN HEMT type, comprising a substrate, a heterojunction formed on the substrate, a gate electrode, a drain electrode and a source electrode with interdigitated fingers, a first connection track electrically connecting the fingers of the drain electrode to one another and a second connection track electrically connecting the fingers of the source electrode to one another. Each finger of the drain electrode is connected to the first connection track through a fuse. The fuses are able to be broken, during the operation of the transistor, to electrically insulate defective drain fingers (for example in short-circuit with the gate electrode), whereas the other drain fingers remain operational.

A drawback of this transistor is that, despite the breakage of the fuses, leakage currents may circulate in the defective drain fingers. Indeed, according to the document ["Electrical Breakdown in Atmospheric Air Between Closely Spaced (0.2 μm-40 μm) Electrical Contacts", P. G. Slade et al., IEEE Transactions On Components And Packaging Technologies, Vol. 25, N°3, 2002], the breakdown voltage does not exceed 450 V for a space between two electrodes less than or equal to 25 μm.

SUMMARY OF THE INVENTION

The present invention aims to resolve the problem that has just been mentioned. To this end, a first aspect of the invention relates to a field effect transistor comprising:

a substrate;
a semiconductor structure formed on a main face of the substrate, the semiconductor structure comprising a channel area;
a first electrode and a second electrode between which extends the channel area, the first electrode comprising a plurality of portions spaced apart from each other, each portion of the first electrode contributing to forming an elementary transistor referred to as "island";
connection tracks for electrically connecting the portions of the first electrode to one another;
first fuse areas each connecting an associated portion of the first electrode to a connection track;
at least one second fuse area broken so as to electrically insulate an associated portion of the first electrode belonging to a defective island;
a passivation layer arranged on the islands, the connection tracks and the fuse areas, the passivation layer occupying each space created by the breakage of said at least one second fuse area.

The field effect transistor according to the first aspect of the invention may also comprise one or more characteristics among the following considered individually or according to all technically possible combinations thereof.

According to an embodiment, the fuse areas extend along a longitudinal direction.

According to an embodiment, each island has a maximum operating current, the fuse areas being dimensioned so as to withstand the maximum operating current.

According to an embodiment, the second electrode also comprises a plurality of portions spaced apart from each other, the portions of the first electrode and the second electrode being arranged in an alternating manner to form a checker type pattern.

According to an embodiment, the fuse areas are made of the same material as the connection tracks.

According to an embodiment, the fuse areas are made of copper, aluminium or tungsten.

A second aspect of the invention relates to a method for manufacturing a field effect transistor. This manufacturing method comprises the following steps:

forming a semiconductor structure on a main face of a substrate, the semiconductor structure comprising a channel area;
forming a first electrode and a second electrode between which extends the channel area, the first electrode comprising a plurality of portions spaced apart from each other, each portion of the first electrode contributing to forming an elementary transistor referred to as "island";
forming connection tracks for electrically connecting the portions of the first electrode to one another;
forming fuse areas each associated with a portion of the first electrode of an island, each fuse area connecting the associated portion of the first electrode to a connection track and being capable of being broken in such a way as to electrically insulate said island if it is defective;
breaking each fuse area associated with the portion of the first electrode of a defective island;
depositing a passivation layer on the islands, the connection tracks and the fuse areas, the passivation layer occupying each space created by the breakage of a fuse area.

The use of fuse areas makes it possible to electrically insulate all the defective islands during a single step of the manufacturing method, which represents a considerable time saving.

The manufacturing method according to the second aspect of the invention may also comprise one or more characteristics among the following considered individually or according to all technically possible combinations thereof.

According to an embodiment, the breakage step consists in applying a current of increasing intensity between the first electrode and the second electrode.

According to an embodiment, the breakage step consists in applying a current ramp between the first electrode and the second electrode.

According to an embodiment, the current ramp is combined with a voltage limitation.

According to an embodiment, the manufacturing method comprises, between the breakage step and the step of deposition of the passivation layer, a cleaning step intended to eliminate residues resulting from the breakage step.

According to an embodiment, the manufacturing method comprises a step of verifying that each fuse area associated with the portion of the first electrode of a defective island is actually broken.

BRIEF DESCRIPTION OF THE FIGURES

The invention and the different applications thereof will be better understood on reading the description that follows and by examining the figures that accompany it, among which.

The figures are schematic and, in order to make them easier to read, do not respect the proportions between the different elements represented.

The figures are only presented for indicative purposes and in no way limit the invention.

For greater clarity, identical or similar elements are marked by identical reference signs in all of the figures.

DETAILED DESCRIPTION OF EMBODIMENTS OF THE INVENTION

Figure 1A:
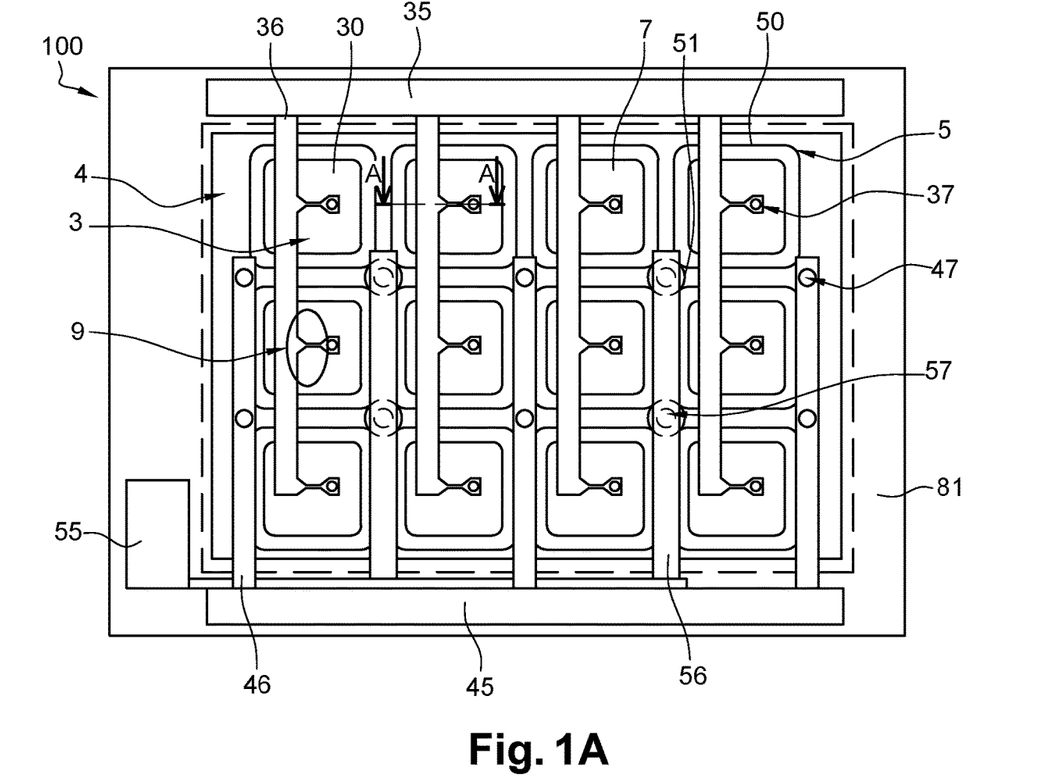
FIG. 1A is a top view of a transistor, according to a first embodiment of the invention.
Figure 1B:
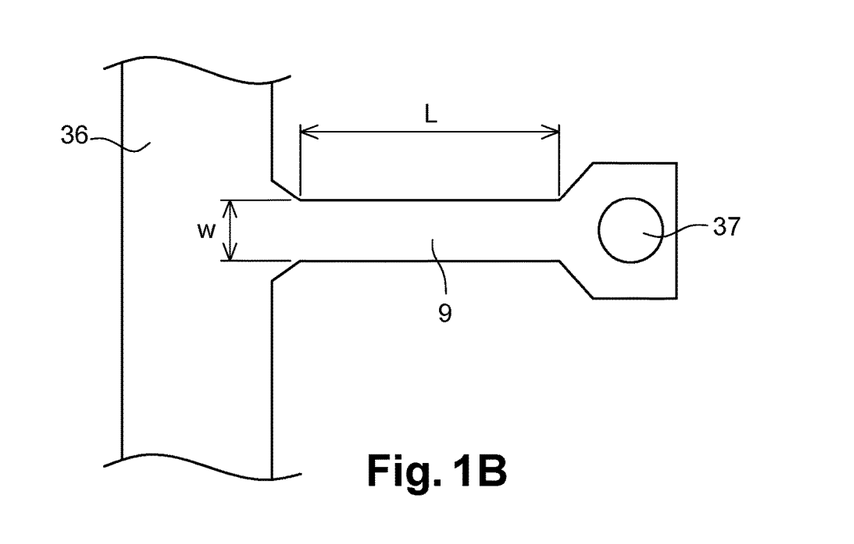
FIG. 1B is an enlarged view of a fuse area of the transistor of FIG. 1A.
Figure 1C:
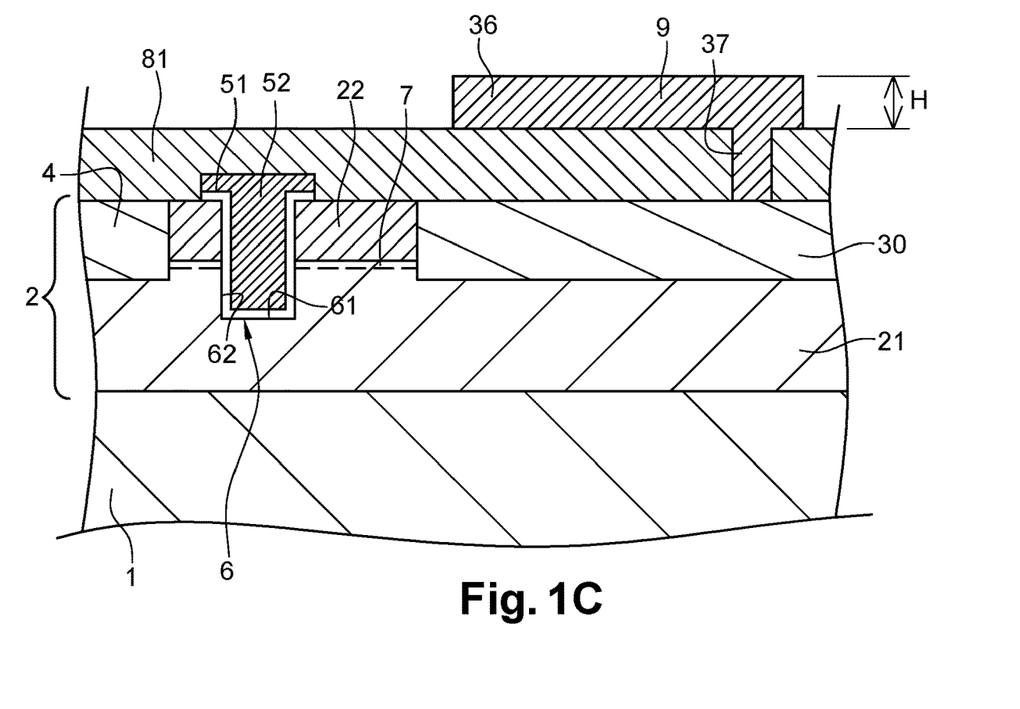
FIG. 1C is a cross-section view along the line A-A of the transistor of FIG. 1A.

A first embodiment of a field effect transistor 100 according to the invention will now be described with reference to FIGS. 1A, 1B and 1C. The transistor 100 is for example a High Electron Mobility Transistor (HEMT). Such a transistor 100 is generally intended for power applications. However, the present invention may of course be applied to other types of transistors.

The transistor 100 comprises a substrate 1 and a semiconductor structure 2 formed on the substrate 1. The semiconductor structure 2 comprises for example a first semiconductor layer 21 arranged on the substrate 1 and a second semiconductor layer 22 arranged on the first semiconductor layer 21. The first semiconductor layer 21 and the second semiconductor layer 22 are for example respectively made of gallium nitride (GaN) and aluminium gallium nitride (AlGaN). In this case, an electron gas is intrinsically formed by heterojunction at the interface between the first semiconductor layer 21 and the second semiconductor layer 22.

The substrate 1 may be an insulator or a semiconductor such as intrinsic or doped silicon. Advantageously, the substrate 1 is silicon with crystal lattice orientation along the direction <111> which makes it possible to facilitate the growth of gallium nitride on the surface thereof. The substrate 1 may also be silicon carbide, gallium nitride or sapphire.

The transistor 100 comprises a drain electrode 3 and a source electrode 4 formed on the semiconductor structure 2. The drain electrode 3 and the source electrode 4 are for example made of metal such as titanium or aluminium.

In this first embodiment, the drain electrode 3 has an island topology, that is to say that it comprises several drain portions 30 spaced apart from each other. The drain portions 30 are here surrounded by the source electrode 4. By extension, it is said that the transistor 100 has an island topology. Generally speaking, a transistor has an island topology when its drain electrode and/or its source electrode have an island topology.

Each drain portion 30 contributes to the formation of an elementary transistor, the transistor 100 resulting from the placing in parallel of these elementary transistors. In the remainder of the description, the term "island" may be used to designate interchangeably a drain portion 30 or the elementary transistor to which this drain portion 30 belongs.

The transistor 100 also comprises a gate electrode 5 arranged between the drain electrode 3 and the source electrode 4. The gate electrode comprises for example several gate portions 50 each surrounding a drain portion 30. Each gate portion 50 is for example arranged in a cavity 6 formed through the second semiconductor layer 22. The cavity 6 extends into the first semiconductor layer 21. However, the cavity 6 does not completely traverse the first semiconductor layer 21. The cavity 6 thus comprises a bottom 61 formed by the first semiconductor layer 21 and side walls 62 formed by the stack of the first semiconductor layer 21 and the second semiconductor layer 22.

The gate electrode 5 comprises a gate insulator layer 51 covering the bottom 61 and the side walls 62 of the cavity 6. The gate electrode 5 here comprises a lateral overlap on either side of the cavity 6. In other words, the gate insulator layer 51 extends outside of the cavity 6 onto the second semiconductor layer 22. The gate insulator layer 51 is for example made of aluminium oxide. However, other known insulator materials of the microelectronics industry may be suited to the formation of the gate insulator layer 51.

The gate electrode 5 also comprises an electrically conductive gate material 52 arranged in the cavity 6, in a space not occupied by the gate insulator layer 51. The gate material 52 is separated from the semiconductor layers 21, 22 by the gate insulator layer 51. The gate material 52 is in contact with the gate insulator layer 51. The gate material 52 may also extend beyond the cavity 6 without ever entering into contact with the semiconductor layers 21, 22. The gate material 52 is for example metal such as titanium nitride, tungsten or nickel.

The transistor 100 comprises a channel area 7 extending between the drain electrode 3 and the source electrode 4 and in which conduction is controlled by the gate electrode 5. The channel area 7 here corresponds to the electron gas present at the interface between the first semiconductor layer 21 and the second semiconductor layer 22. The island topology makes it possible to increase the density of the channel area 7 compared to conventional interdigitated geometries. The advantage of island topology is that it makes it possible to insulate defective areas if appropriate. It is however possible to produce interdigitated islands.

The transistor 100 is for example of normally-off type, that is to say that in the absence of bias, the transistor 100 is off. To turn the transistor 100 on, it is necessary to accumulate sufficient electrons in the channel area 7 under the gate electrode 5. To do so, it is necessary to apply a potential difference between the source electrode 4 and the gate electrode 5 greater than a positive threshold voltage.

The transistor 100 comprises a first pad 35, a second pad 45 and a third pad 55 provided to produce respectively the drain contact, the source contact and the gate contact.

The drain portions 30 are electrically connected to the first pad 35 through first connection tracks 36 and first interconnection vias 37. A first interconnection via 37 is for example arranged on each drain portion 30.

The source electrode 4 is electrically connected to the second pad 45 through second connection tracks 46 and second interconnection vias 47 distributed over the source electrode 4. Thus, although in this embodiment the source electrode 4 is continuous, the access resistance to the source electrode 4 is reduced.

Advantageously, the transistor 100 comprises gate areas 53 configured to electrically connect adjacent gate portions 50. For example, each gate area 53 electrically connects four gate portions 50 arranged in a square.

The gate portions 50 are electrically connected to the third pad 55 through third connection tracks 56 and third interconnection vias 57. A third interconnection via 57 is for example arranged on each gate area 53 of the gate electrode 5.

The connection tracks 36, 46, 56 are each made of an electrically conductive material. The connection tracks 36, 46, 56 are preferably made of metal such as copper, aluminium or AlCu alloy.

The transistor 100 comprises a first passivation layer 81 that covers the semiconductor structure 2 and the drain 3, source 4 and gate 5 electrodes. The first passivation layer 81 is for example made of silicon oxide or silicon nitride. The interconnection vias 37, 47, 57 are formed through the first passivation layer 81.

Each drain portion 30 is connected to one of the first connection tracks 36 through a fuse area 9. The fuse areas 9 associated with defective islands are broken during the manufacture of the transistor 100, as described in greater detail hereafter. Thus, thanks to the invention, it is possible to connect only the functional islands.

In the context of the invention, "defective islands" is taken to mean islands (or elementary transistors) which are in short-circuit, that is to say islands for which there exists a path for the passage of electrical current between the drain electrode 3 and the source electrode 4. In the case for example of the transistor 100 which is of the normally-off type, it is considered that when the gate is not biased and when the transistor 100 is on, it is that it comprises at least one defective island.

The fuse area 9 is made of an electrically conductive fuse material, preferably identical to that used to make the first connection tracks 36. The fuse area 9 is for example arranged on the first passivation layer 81, between the first interconnection via 37 and the corresponding first connection track 36.

Advantageously, the fuse area 9 extends along a longitudinal direction, that is to say along a direction substantially parallel to the plane in which extends the substrate 1. Thus, when the fuse area 9 breaks, the fuse material has the possibility of extending. In this case, the fuse area 9 is not confined, unlike for example the case of a transversal orientation produced by means of a via. In other words, the longitudinal orientation of the fuse area 9 makes it possible to facilitate the evacuation of fuse material during breakdown in order that the fuse area 9 no longer forms an electrically conductive path.

The fuse area 9 has for example a general parallelepiped shape having a length L, a width W and a height H. Furthermore, each island of the transistor 100 is designed to have a certain current rating. Advantageously, the fuse area 9 is dimensioned so as to be compatible with the current rating of the islands of the transistor 100. Thus, it is ensured that the fuse area 9 does not break down when the transistor 100 is in operation. In other words, the dimensions of the fuse area 9 allows it to withstand the passage of the operating current corresponding to the rating of the islands of the transistor 100.

The fuse area 9 may also be dimensioned as a function of the time before breakdown that it is wished to obtain. In the context of the invention, "time before breakdown" is taken to mean the time that the fuse area takes to break when it is traversed by a given current intensity.

The time before breakdown $t_{break}$ is for example calculated by equalising the electrical energy supplied to the fuse area 9 with the sum of the thermal energy absorbed by the fuse area 9 and the thermal energy evacuated by the fuse area 9 into the air at the melting temperature $T_{melt}$ of the fuse material according to the following equation:

$$\rho \cdot (1 + (T_{melt} - 300) \cdot T_{coeff}) \cdot \frac{L}{H \cdot W} \cdot I^2 \cdot t_{break} = \quad (1)$$
$$C_P \cdot L \cdot H \cdot W \cdot D \cdot (T_{melt} - 300) + h \cdot L \cdot (2H + W) \cdot (T_{melt} - 300) \cdot t_{break}$$

where $\rho$, $C_P$ and D are respectively the resistivity, the calorific capacity and the density of the fuse material, I is the current traversing the fuse area 9, and h is the thermal exchange coefficient of the fuse material with air. $T_{coeff}$ is the temperature coefficient of the resistivity.

The time before breakdown $t_{break}$ as a function of the current intensity I may then be defined by the following expression:

$$t_{break}(I) = \frac{C_P \cdot H \cdot W \cdot D \cdot (T_{melt}^0 - 300)}{\rho \cdot (1 + (T_{melt}^0 - 300) \cdot T_{coeff}^0) \cdot \frac{1}{H \cdot W} \cdot I^2 - h \cdot (2H + W) \cdot (T_{melt}^0 - 300)} \quad (2)$$

Figure 2:
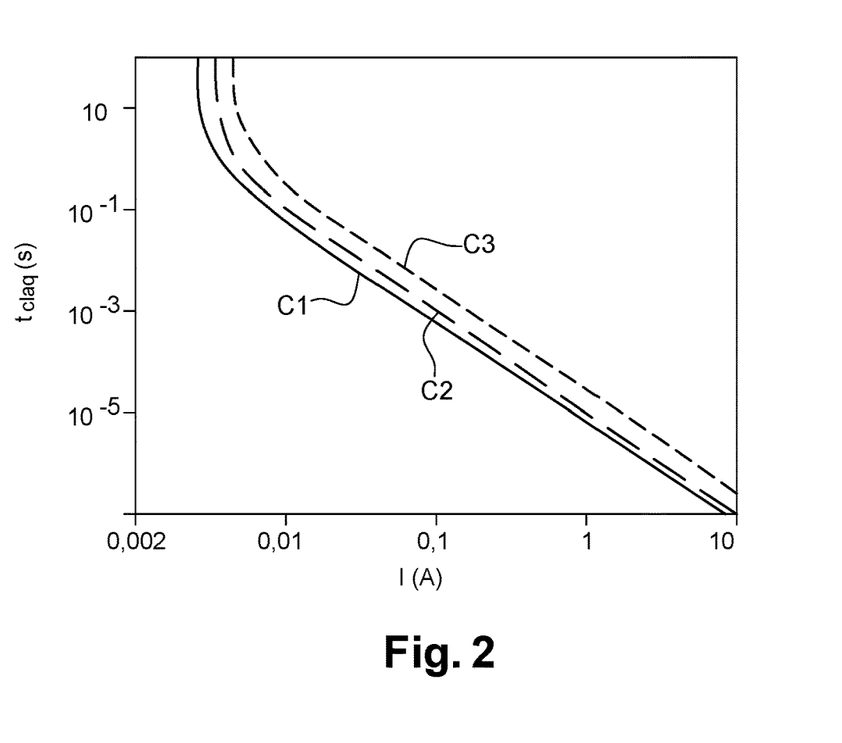
FIG. 2 represents curves of variation of the breakdown time of a fuse area as a function of the intensity of the electrical current traversing the fuse area, each curve corresponding to a different material with which the fuse area is made.

FIG. 2 represents three examples of curves C1, C2, C3 of variation of the time before breakdown $t_{break}$ of a fuse area having a square section of 5 μm sides as a function of the intensity I of the electrical current traversing the fuse area. The first curve C1 corresponds to a copper fuse area, the second curve C2 corresponds to an aluminium fuse area and the third curve C3 corresponds to a tungsten fuse area. Aluminium and copper are considered as being advantageous candidates because they are conventionally used in the microelectronics industry to produce interconnections, which makes it possible to produce the connection tracks and the fuse areas during a same step. Copper is considered as being more advantageous than aluminium because copper has a higher current withstand and a lower resistivity than aluminium.

Figure 3:
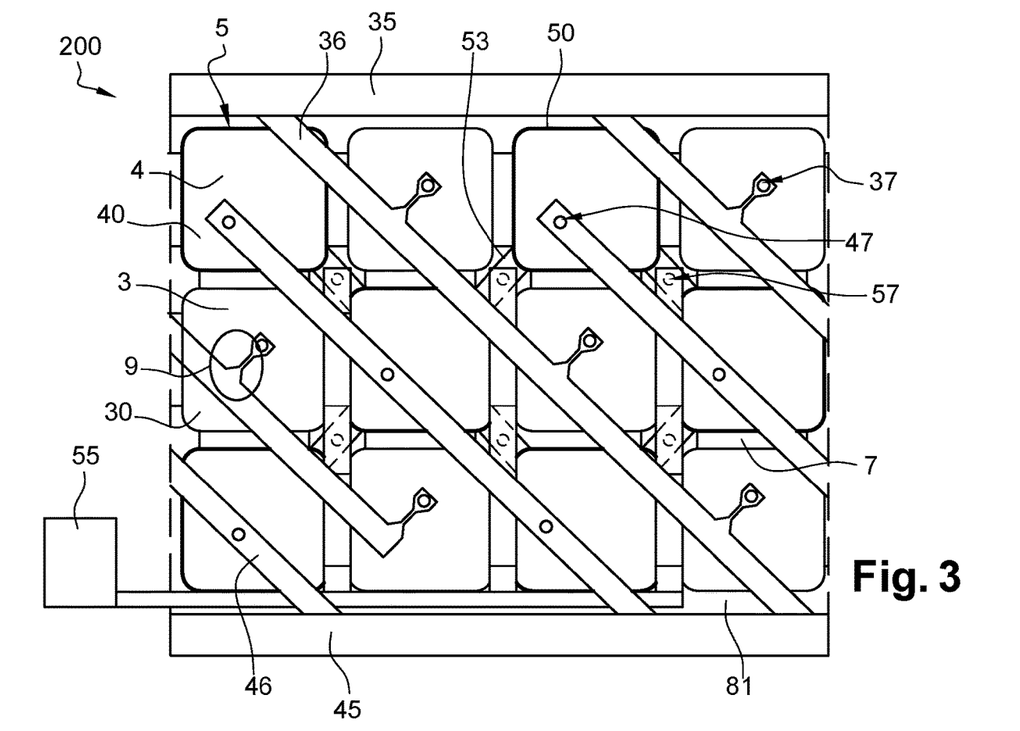
FIG. 3 is a top view of a transistor, according to a second embodiment of the invention.

FIG. 3 shows a field effect transistor 200 according to a second embodiment of the invention in which the source electrode 4 also has an island topology. The source electrode 4 in fact comprises several source portions 40 spaced apart from each other. The drain portions 30 and the source portions 40 are here arranged in an alternating manner to form a checker type pattern.

In this second embodiment, the gate portions 50 surround the source portions 40 and are connected two by two by the gate areas 53. Each gate area 53 is arranged between two diagonally adjacent gate portions 50, as illustrated in FIG. 3.

In an alternative of this second embodiment, the fuse areas may be arranged between the source portions 40 and the second connection tracks 46.

Another aspect of the present invention relates to a method for manufacturing the field effect transistor according to any one of the embodiments described above.

The manufacturing method comprises steps of formation of the semiconductor structure 2 on the substrate 1, drain 3, source 4 and gate 5 electrodes, pads 35, 45, 55, connection tracks 36, 46, 56 and interconnection vias 37, 47, 57. These steps being furthermore known from the prior art, they will not be described in greater detail in the present application.

The manufacturing method also comprises a step of formation of the fuse areas 9. Each fuse area 9 is formed between an associated portion of electrode and a connection track. As detailed beforehand, when the fuse areas 9 are made of the same material as the connection tracks, they may be formed during the same step.

The manufacturing method further comprises a step of breakage of the fuse areas 9 associated with defective islands. To do so, a current of increasing intensity may be applied to the field effect transistor between the source contact and the drain contact. The applied current mainly passes through the defective islands which causes the breakage of the corresponding fuse areas 9. Thus, the defective islands are electrically insulated. It thus involves an overall insulation method, that is to say that it functions simultaneously on the whole of the transistor. Such a method enables time savings compared to the method of the prior art consisting in testing the islands one by one to determine which are defective.

In other words, the step of breakage of the fuse areas 9 makes it possible to sort, during the manufacture of the field effect transistor, defective islands and functional islands. The fuse areas 9 of the defective islands are broken simultaneously, whereas the fuse areas 9 of the functional islands remain intact and connect the electrode portions to the connection tracks. A fuse area is characterised by an absence of metal between the associated portion of electrode and the connection track.

Unlike a simple current or voltage pulse, a current of increasing intensity, for example in the form of a ramp, enables a natural adaptation of the breakage intensity to the number of fuses to break down (which is not known beforehand). It is thus ensured that all the fuses of the defective islands have been broken, whatever the number of these defective islands.

Advantageously, the current of increasing intensity (e.g. the current ramp) is accompanied with a voltage limitation in order to avoid damaging the islands of the transistor. This is particularly useful for transistors having a small voltage rating, such as transistors intended for audio applications.

Figure 4:
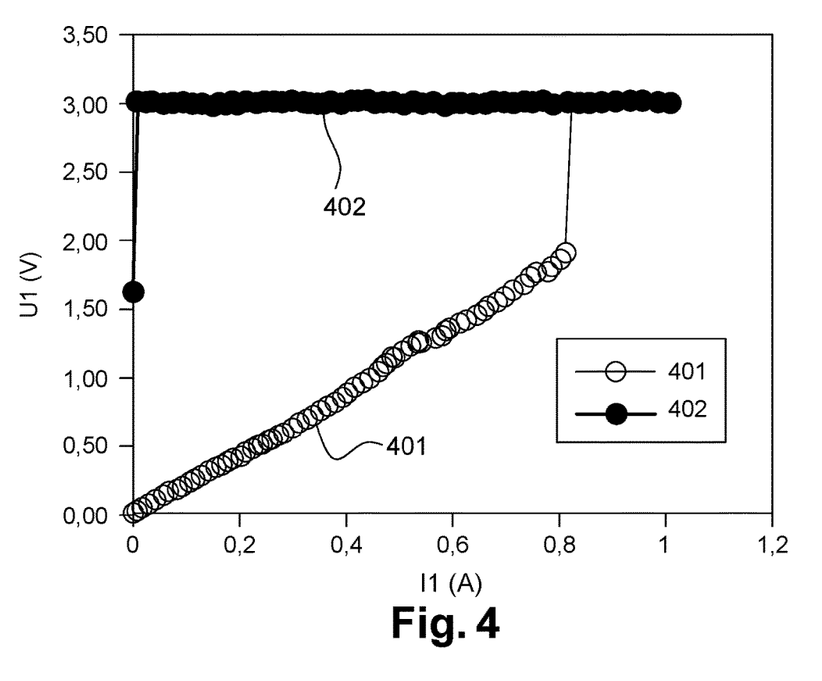
FIG. 4 represents curves of variation of the voltage as a function of the current in a test structure comprising a fuse area.

FIG. 4 shows an example of curves of variation 401, 402 of the voltage U1 at the terminals of a test structure as a function of the current I1 that traverses the test structure. The test structure is configured to model the behaviour of an island of the transistor 100. The test structure comprises two bias pads between which is arranged an aluminium fuse area having a square section of 5 μm sides. In this example, the voltage limitation of the current ramp is set at 3 V.

The first curve 401 corresponds to the step of breakage of the fuse area. It involves a first application of the current ramp to the test structure. The first curve 401 shows that the fuse area breaks down at around 0.8 A, the voltage U1 at the terminals of the test structure next being capped at the limit value of 3 V.

The second curve 402 here corresponds to a second application of the current ramp I1 to the test structure in order to ensure that the fuse area is correctly broken and is not reformed. The second curve 402 clearly shows that this is the case since as of the start of the ramp, the voltage U1 at the terminals of the test structure is capped at 3 V.

Figure 5:
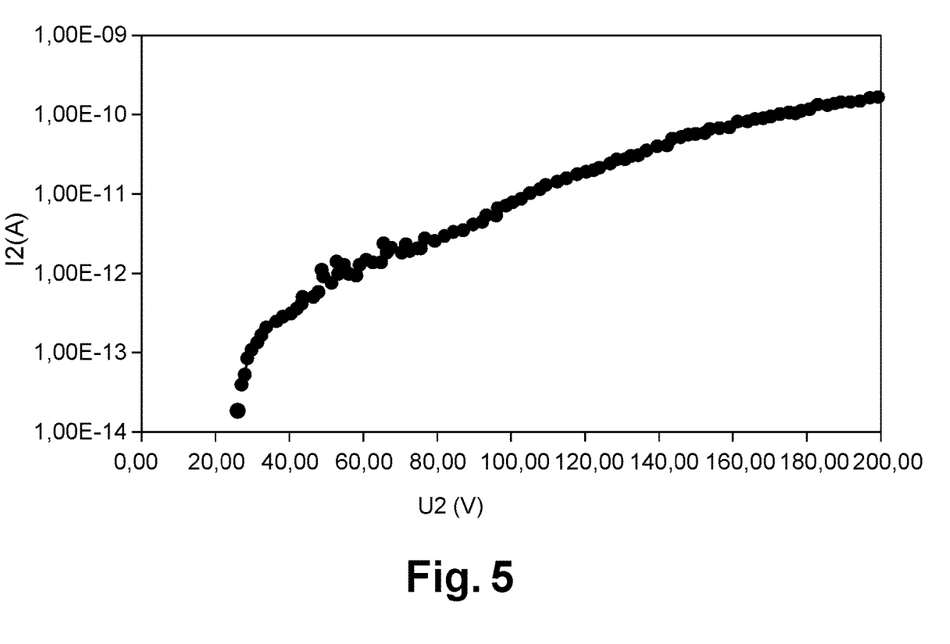
FIG. 5 represents a curve of variation of the leakage current as a function of the voltage in the test structure of FIG. 4, when the fuse area is broken.

FIG. 5 shows the variation of the leakage current I2 of the test structure as a function of the bias voltage U2 applied to the test structure, after the fuse area is broken. It is observed that no matter the value of the bias voltage U2, the leakage current I2 remains negligible. This verification makes it possible to demonstrate that the fuse area is indeed broken.

After the step of breakage of the fuse areas, the manufacturing method may comprise a cleaning step to eliminate residues resulting from the breakdown of the fuse areas. These residues are liable to decrease the voltage withstand of the field effect transistor. The absence of residues in the space created by the breakage of a fuse area 9 reduces the risk that a short-circuit forms between the disconnected electrode portion and the connection track. The cleaning step comprises for example a first cleaning operation using an acid solution intended to eliminate metal residues. The cleaning step may also comprise a second cleaning operation using a basic solution intended to eliminate organic residues.

A second passivation layer is next deposited before producing the metal levels connecting to one another the connection tracks of the source, drain and gate electrodes, as well as the following passivation layers. This second passivation layer is deposited on all of the islands (advantageously covered with the first passivation layer 81; cf. FIG. 1A), the connection tracks and the fuse areas 9. It further occupies each space created by the breakage of a fuse area 9, that is to say the space situated between the terminals of a broken fuse. In other words, it is arranged within each broken fuse area 9. In this way, the electrical insulation of the defective islands is reinforced and the risk of leakage currents in these islands is avoided.

The second passivation layer comprises a dielectric material, for example silicon nitride or silicon oxide.

Naturally, the invention is not limited to the embodiments described with reference to the figures and alternatives could be envisaged without going beyond the scope of the invention. The present invention may notably be applied to a normally-on type transistor. In this case, during the step of breakage of the fuse areas, the gate of the transistor is biased with a negative voltage so as to turn the transistor off.

The invention claimed is:

1. A field effect transistor comprising:
   a substrate;
   a semiconductor structure formed on a main face of the substrate, the semiconductor structure comprising a channel area;
   a first electrode and a second electrode between which extends the channel area, the first electrode comprising a plurality of portions spaced apart from each other, each portion of the first electrode contributing to forming an elementary transistor constituting an island;
   connection tracks for electrically connecting the portions of the first electrode to one another;
   first fuse areas each connecting an associated portion of the first electrode to a connection track;
   at least one second fuse area broken in such a way as to electrically insulate an associated portion of the first electrode belonging to a defective island;
   a passivation layer arranged on the islands, the connection tracks and the fuse areas, the passivation layer occupying each space created by the breakage of said at least one second fuse area.

2. The field effect transistor according to claim 1, wherein the fuse areas extend along a longitudinal direction.

3. The field effect transistor according to claim 1, wherein each island has a maximum operating current, the fuse areas being dimensioned so as to withstand the maximum operating current.

4. The field effect transistor according to claim 1, wherein the second electrode also comprises a plurality of portions spaced apart from each other, the portions of the first electrode and the second electrode being arranged in an alternating manner to form a checker type pattern.

5. The field effect transistor according to claim 1, wherein the fuse areas are made of the same material as the connection tracks.

6. The field effect transistor according to claim 1, wherein the fuse areas are made of copper, aluminium or tungsten.

7. A method for manufacturing a field effect transistor, comprising the following steps:
   forming a semiconductor structure on a main face of a substrate, the semiconductor structure comprising a channel area;
   forming a first electrode and a second electrode between which extends the channel area, the first electrode comprising a plurality of portions spaced apart from each other, each portion of the first electrode contributing to forming an elementary transistor constituting an island;
   forming connection tracks for electrically connecting the portions of the first electrode to one another;
   forming fuse areas each associated with a portion of the first electrode of an island, each fuse area connecting the associated portion of the first electrode to a connection track and being capable of being broken in such a way as to electrically insulate said island if it is defective;
   breaking each fuse area associated with the portion of the first electrode of a defective island;
   depositing a passivation layer on the islands, the connection tracks and the fuse areas, the passivation layer occupying each space created by the breakage of a fuse area.

8. The method according to claim 7, wherein the breaking consists in applying a current of increasing intensity between the first electrode and the second electrode.

9. The method according to claim 7, wherein the breaking consists in applying a current ramp between the first electrode and the second electrode.

10. The method according to claim 9, wherein the current ramp is combined with a voltage limitation.

11. The method according to claim 7, further comprising, between the breaking step and the depositing step of the passivation layer, a cleaning step to eliminate residues resulting from the breaking step.

12. The method according to claim 7, further comprising a step of verifying that each fuse area associated with the portion of the first electrode of a defective island is actually broken.

* * * * *